United States Patent
Morley

(10) Patent No.: US 6,942,536 B2
(45) Date of Patent: Sep. 13, 2005

(54) FORMING ORGANIC LIGHT EMITTING DEVICE DISPLAYS ON THINNER SUBSTRATES

(75) Inventor: Roland M. Morley, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 142 days.

(21) Appl. No.: 10/441,802

(22) Filed: May 20, 2003

(65) Prior Publication Data

US 2003/0201714 A1 Oct. 30, 2003

Related U.S. Application Data

(62) Division of application No. 09/923,239, filed on Aug. 3, 2001, now abandoned.

(51) Int. Cl.$^7$ .................................................. H01J 9/00
(52) U.S. Cl. ....................................................... 445/24
(58) Field of Search .......................... 445/23–25, 50–52; 313/504–506

(56) References Cited

U.S. PATENT DOCUMENTS 4,733,947 A * 3/1988 Ota et al. .................... 349/158

* cited by examiner

Primary Examiner—Joseph Williams
(74) Attorney, Agent, or Firm—Trop, Pruner & Hu, P.C.

(57) ABSTRACT

An organic light emitting device display may be formed with a first layer having standard thicknesses. The first layer may be manufactured to include the organic light emitting device material. The first layer may be secured to a second layer to form a panel. Thereafter, the resulting panel can be subjected to a grinding operation to reduce the thickness of the first layer.

8 Claims, 2 Drawing Sheets

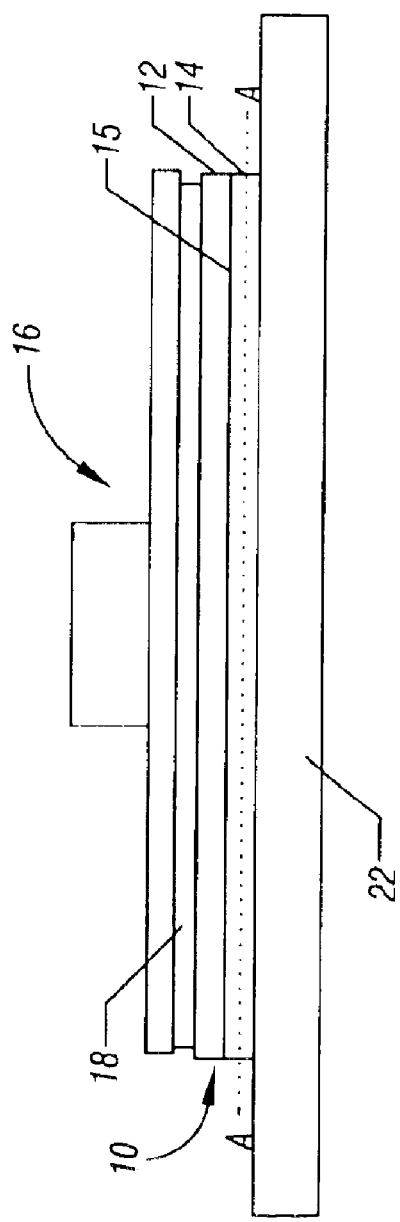
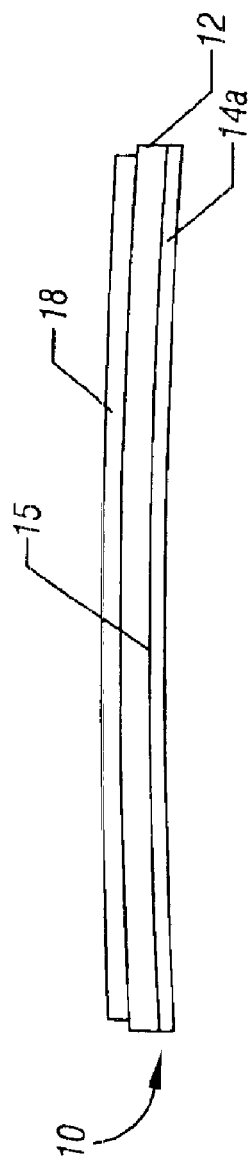
FIG. 3
FIG. 4

FORMING ORGANIC LIGHT EMITTING DEVICE DISPLAYS ON THINNER SUBSTRATES

This is a divisional of prior application Ser. No. 09/923,239, filed Aug. 3, 2001 now abandoned.

BACKGROUND

This invention relates generally to organic light emitting device (OLED) displays.

In an OLED display, an organic light emitting material is subjected to an appropriate potential, causing the material to emit light. Organic light emitting device displays may be formed of a plurality of components including a glass substrate. In one form of OLED display, the light emitting material is deposited on a glass substrate. The glass substrate may then be joined with another layer, such as ceramic layer, that provides for interconnections to various driver circuits and the like.

Generally, the light emitting material is formed on the back side of the glass substrate. Thus, the emitted light shines through the glass substrate to the viewer. Thinner glass substrates improve display contrast, resolution and improve the ability to interface with microlenses.

Current organic light emitting device displays employ glass substrates with thicknesses of between 0.5 to 0.7 millimeters (thicker glass substrates). These thicknesses are compatible with pixel spacings of 1.5 millimeters and greater. As pixel pitch becomes smaller, the use of thinner glass substrates becomes more desirable. However, thinner glass substrates (less than 0.5 millimeters) including those as thin as 0.2 millimeters are not amenable to volume manufacturing. In particular, the use of thinner glass substrates raises material handling problems resulting in lower yields.

Conventional glass handling machines are not specifically adapted for relatively thin glass substrates. Thus, to handle such thinner glass substrates, special equipment may be required, increasing the cost of display manufacture.

For a variety of reasons, it would be desirable to have organic light emitting displays that use thinner glass substrates.

Thus, there is a need for better ways to enable the use of thinner glass substrates for forming OLED displays.

BRIEF DESCRIPTION OF THE DRAWINGS

FIG. 3 is a side elevational view of the embodiment shown in FIG. 1 at a subsequent point in the manufacturing process; and FIG. 4 is a side elevational view of the completed assembly.

DETAILED DESCRIPTION

Figure 1:
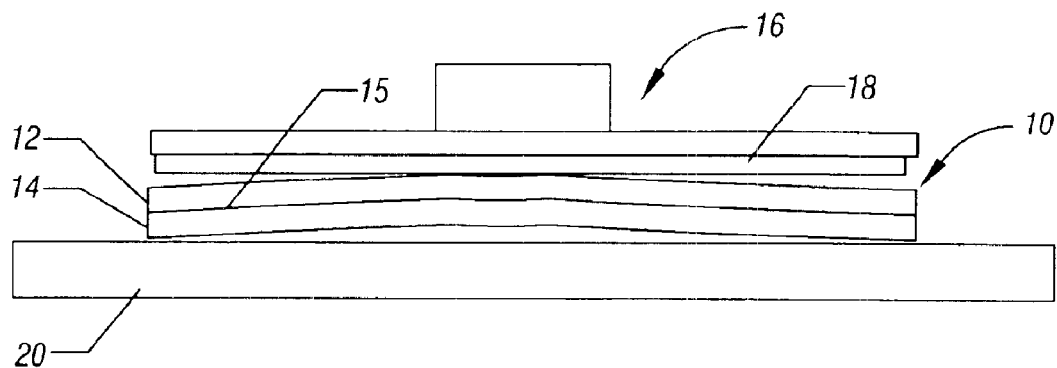
FIG. 1 is a side elevational view of one embodiment of the present invention.

Referring to FIG. 1, an organic light emitting device display panel 10 may include a pair of layers 12 and 14. In one embodiment, the layer 14 may be formed of glass and the layer 12 may be formed of a ceramic material. The layer 14 may have standard thicknesses and may be manufactured to include the organic light emitting device material 15. The first layer may be secured to the layer 12 to form the panel 10.

The composite panel 10 may be electrically coupled to external integrated circuits. The layers 12 and 14 may be electrically coupled using bump bonding or surface mounting in one embodiment. The region between the layers 12 and 14 may be underfilled with a filler such as epoxy after surface mounting, in order to distribute mechanical stresses between components evenly over the panel 10 surface.

The panel 10 may not be perfectly flat but may have a camber in some embodiments. This camber may be the result of the materials as supplied or the result of assembly processes. The panel 10 may be laid on an optically flat reference surface 20 with the glass layer 14 against the reference surface 20. The layer 12 may be abutted against a grinding fixture 16 coated with an adhesive 18 such as epoxy. Alternatively, other adhesives or sticky materials may be utilized.

Figure 2:
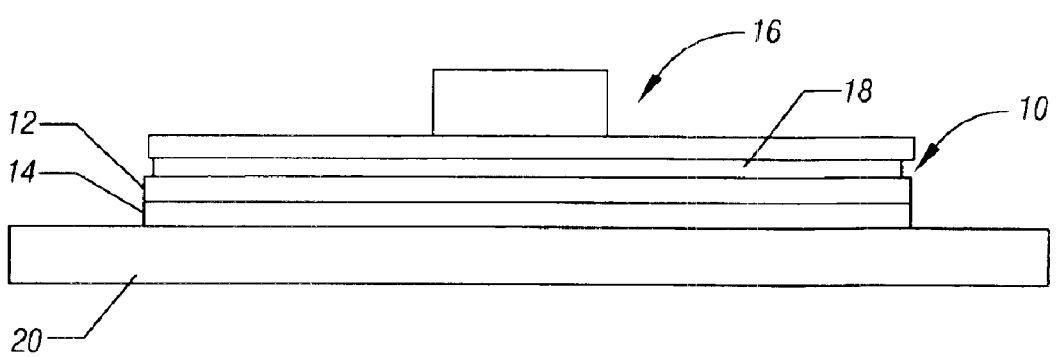
FIG. 2 is a side elevational of the embodiment shown in FIG. 1 at a later point in the manufacturing process.

The panel 10 may then be flattened (if needed) by applying pressure through the grinding fixture 16 against the optically flat reference surface 20, causing the panel 10 to assume the flattened configuration shown in FIG. 2. In another embodiment, the panel 10 may be pushed onto the reference surface 20 by applying pressure to the rear of the panel 10 or by applying reduced pressure or suction at the interface with the reference surface 20. In some embodiments, the surface 20 may be a vacuum chuck that draws the panel 10 against the surface 20.

In the position shown in FIG. 2, the adhesive 18 loosely bonds the blocking tool 16 to the panel 10. A release layer may be provided between the adhesive 18 and the tool 16 in some embodiments.

After the adhesive 18 sets, the panel 10 layer 14 is held in a flat configuration. Referring to FIG. 3, the panel 10 may then be placed on a grinding surface 22. The transfer between the position shown in FIG. 2 and the position shown in FIG. 3 may be accomplished in a flattened configuration. This is because the adhesive 18 holds the panel 10 in a flattened condition against the tool 16.

The grinding surface 22 may then be used to grind down the surface of the glass layer 14 to the thickness indicated by the lines A—A. As a result, a thicker glass layer 14 may be utilized during the manufacturing process. The glass layer 14 may initially have a thickness that provides sufficient structural rigidity. The layer 14 thickness may also be sufficient to make the layer 14 compatible with conventional handling equipment. After the panel 10 has been processed in its thicker configuration, the surface of the layer 14 may then be ground down using the grinding surface 22 to produce the thinner glass layer 14a shown in FIG. 4.

After the layer 14 has been worked to the desired thickness, indicated at 14a, the tool 16 is released by applying a moderate mechanical or thermal shock. The adhesive layer 18 may remain on the rear surface of the panel 10 as indicated in FIG. 4.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming an organic light emitting material on a first layer; and grinding the first layer, with the organic light emitting material formed on the first layer, to a reduced thickness.

2. The method of claim 1 including securing the first layer to a second layer and then grinding the first layer to a reduced thickness.

3. The method of claim 1 including flattening said first layer before grinding said first layer.

4. The method of claim 3 including temporarily securing said first layer to a second layer, flattening said first layer, and then grinding said first layer to a reduced diameter.

5. The method of claim 4 including releasing said first layer from said second layer.

6. The method of claim 4 including temporarily securing said first layer to said second layer using an adhesive.

7. The method of claim 6 including providing a release layer between said second layer and said adhesive.

8. The method of claim 1 including flattening said first layer temporarily while grinding said first layer.

* * * * *